US012638780B2

(12) United States Patent
Trivedi et al.

(10) Patent No.: US 12,638,780 B2
(45) Date of Patent: May 26, 2026

(54) OPTIMIZED MASK STITCHING

(71) Applicant: TAIWAN SEMICONDUCTOR MANUFACTURING COMPANY, LTD., Hsinchu (TW)

(72) Inventors: Sagar Trivedi, Santa Clara, CA (US); Daniel Beylkin, Pasadena, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 89 days.

(21) Appl. No.: 18/231,070

(22) Filed: Aug. 7, 2023

(65) Prior Publication Data

US 2023/0384690 A1    Nov. 30, 2023

Related U.S. Application Data

(62) Division of application No. 17/206,936, filed on Mar. 19, 2021, now Pat. No. 12,436,466.

(51) Int. Cl.
*G03F 7/00* (2006.01)
*G03F 1/36* (2012.01)
*G03F 1/70* (2012.01)

(52) U.S. Cl.
CPC ............ *G03F 7/70441* (2013.01); *G03F 1/36* (2013.01); *G03F 1/70* (2013.01)

(58) Field of Classification Search
CPC ........... G03F 7/70441; G03F 1/36; G03F 1/70
See application file for complete search history.

(56) References Cited

U.S. PATENT DOCUMENTS

| | | | | |
|---|---|---|---|---|
| 2017/0329888 A1* | 11/2017 | Kim | ...................... | G06F 30/398 |
| 2019/0324366 A1* | 10/2019 | He | ........................... | G03F 1/76 |
| 2020/0174380 A1 | 6/2020 | Huang et al. | | |
| 2021/0240087 A1 | 8/2021 | Yu | | |
| 2022/0100079 A1* | 3/2022 | Zhang | .................... | G03F 7/705 |

OTHER PUBLICATIONS

Non-Final Office Action issued in U.S. Appl. No. 17/206,936, dated Mar. 19, 2021.

* cited by examiner

*Primary Examiner* — Jonathan Johnson
*Assistant Examiner* — Jayson D Cosgrove
(74) *Attorney, Agent, or Firm* — STUDEBAKER BRACKETT PLLC

(57) ABSTRACT

A method of manufacturing a photo mask includes determining an enhancement region, in a simulation zone, of a layout pattern of a photo mask. The method includes determining a stitching mobility zone inside the simulation zone, determining an optimization mobility zone inside the stitching mobility zone, and performing an inverse lithographic transformation (ILT) operation of the layout pattern in the simulation zone to generate an ILT adjusted layout pattern in the simulation zone. The method includes combining a weighted sum of the ILT adjusted layout pattern and the layout pattern in the simulation zone to generate an enhanced layout pattern of the photo mask in the simulation zone using a first weighting function inside enhancement region, a second weighting function between boundaries of the enhancement region and the optimization mobility zone, and a third weighting function between boundaries of the optimization mobility zone and the stitching mobility zone.

20 Claims, 14 Drawing Sheets

800

201
203

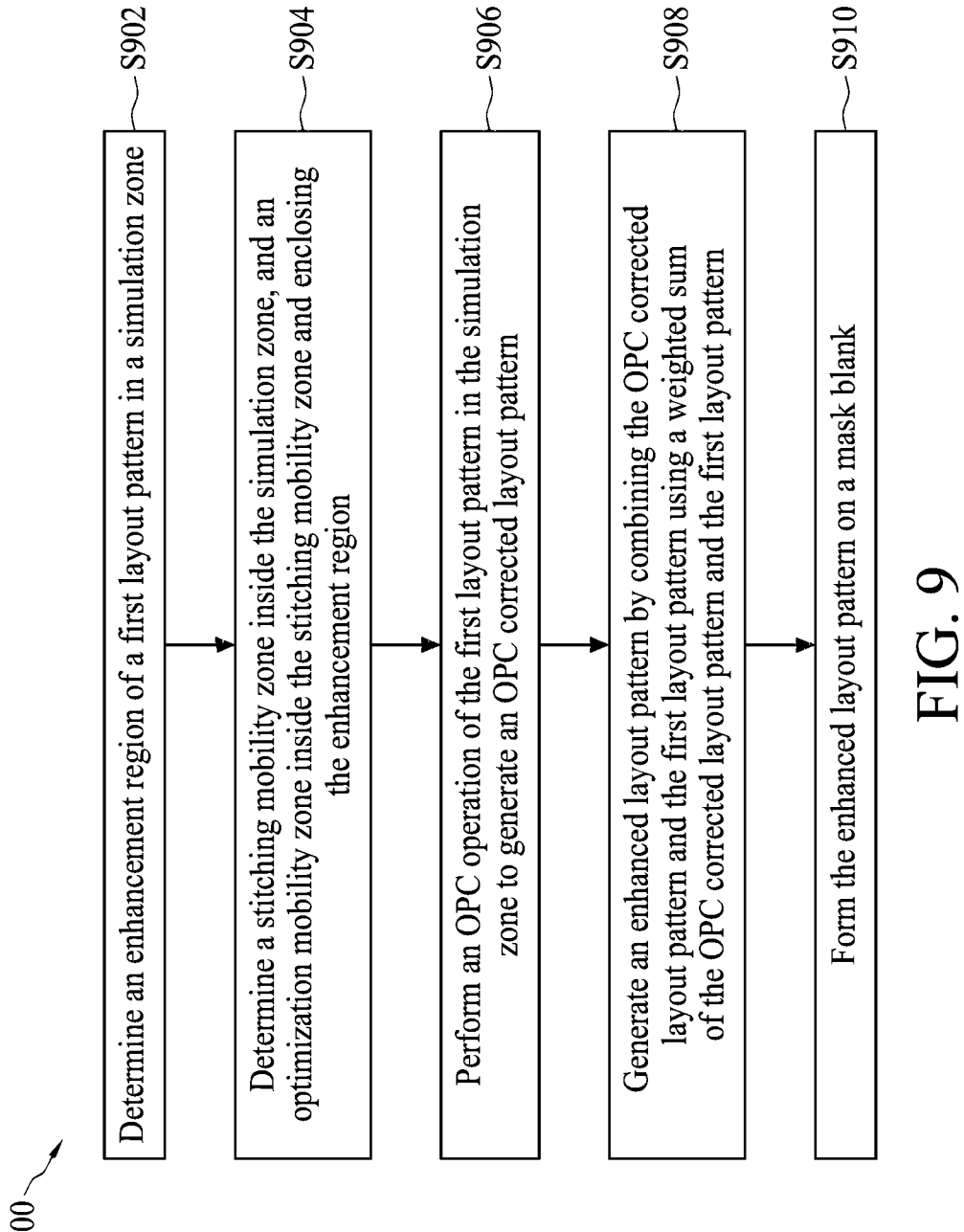

S902 — Determine an enhancement region of a first layout pattern in a simulation zone S904 — Determine a stitching mobility zone inside the simulation zone, and an optimization mobility zone inside the stitching mobility zone and enclosing the enhancement region S906 — Perform an OPC operation of the first layout pattern in the simulation zone to generate an OPC corrected layout pattern S908 — Generate an enhanced layout pattern by combining the OPC corrected layout pattern and the first layout pattern using a weighted sum of the OPC corrected layout pattern and the first layout pattern S910 — Form the enhanced layout pattern on a mask blank

OPTIMIZED MASK STITCHING

RELATED APPLICATIONS

This application is a divisional application of U.S. patent application Ser. No. 17/206,936 filed Mar. 19, 2021, entitled "Optimized Mask Stitching," the entire content of which is incorporated herein by reference.

BACKGROUND

An optical lithography process transfers a layout pattern of a photo mask to the wafer such that etching, implantation, or other steps are applied only to predefined regions of the wafer. Transferring the layout pattern of the photo mask to the resist material layer on the wafer may cause resist pattern defects that are a major challenge in semiconductor manufacturing. An optical proximity correction (OPC) operation may be applied to the layout pattern of the photo mask to reduce resist pattern defects. The OPC may modify the layout patterns of the photo mask before the lithography process to compensate for the effect of the lithography process. In addition, or alternatively, inverse lithographic transformation (ILT) may be performed on the layout patterns of the photo mask to further compensate for the effect of the lithography process. An accurate OPC or ILT operation on the layout patterns of the photo masks is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 9 illustrates a flow diagram of an exemplary process for enhancing a target layout pattern of a photo mask in accordance with some embodiments of the disclosure.

DETAILED DESCRIPTION

Figure 1:
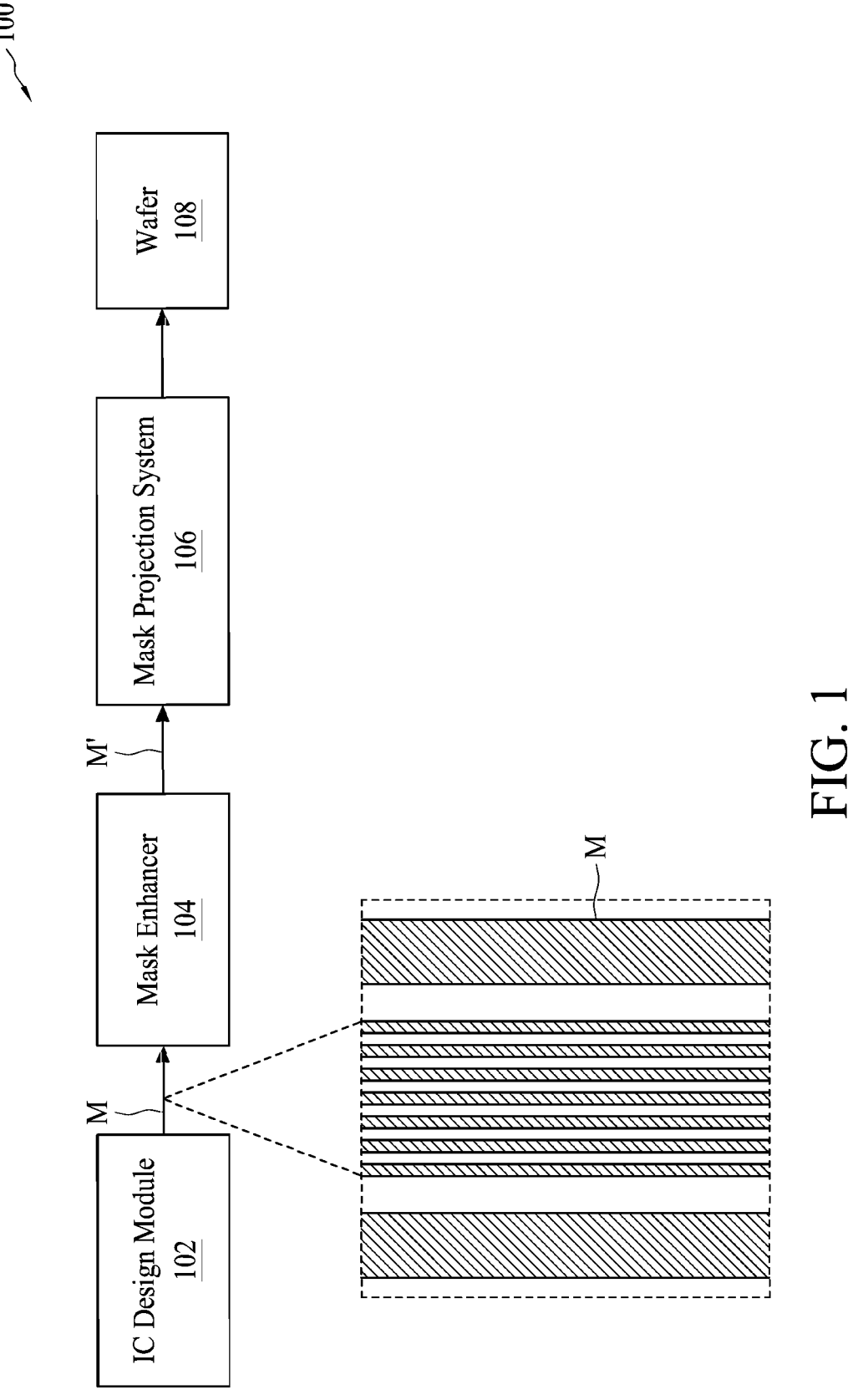
FIG. 1 illustrates a schematic diagram of an exemplary integrated circuit (IC) fabrication flow.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, when a layout pattern of the photo mask is projected, by an optical system of a lithographic system, on a resist material layer of a wafer, a projected pattern of the resist material is generated. The projected pattern of the resist material is inspected for defects that include a bridge or a narrowing. When a defect is detected in the resist pattern of the wafer, one or both of the OPC operation or the ILT operation is applied to the layout pattern of the photo mask to cure the resist pattern defects.

In some embodiments, both OPC and ILT operations are iteratively performed. The OPC and the ILT operations modify a layout pattern of the photo mask. The modified layout pattern of the photo mask is projected, by an optical system of a lithographic system, as a pattern on the resist material layer on the wafer. The projected pattern of the resist material is inspected again for defects. Depending on the existence of one or more defects, the layout pattern of the photo mask is further modified by the OPC and/or ILT operation. The iterative method is repeatedly performed until the defects are corrected. Performing the OPC and/or ILT operation is time consuming and thus, the OPC and/or ILT operation is applied to regions of the layout pattern of the photo mask that cause the defects of the resist material layer on the wafer. In some embodiments, the regions of the of the layout pattern of the photo mask that cause the defects of the resist material layer are hotspots, e.g., hotspot regions, of the layout pattern. In some embodiments, a layout pattern to be produced on a photoresist material layer of a substrate, e.g., on a wafer, is divided into a plurality of enhancement regions and an OPC operation followed by an ILT operation is applied to each one the plurality of enhancement regions. In some embodiments, an enhancement region does not have a hotspot region or has one or more hotspot regions.

Thus, in some embodiments, the OPC and/or ILT operation is applied to the enhancement regions of the layout pattern of the photo mask. The OPC operation generates an OPC corrected layout pattern in the enhancement region and the ILT operation generates an ILT adjusted layout pattern in the enhancement region. When the OPC corrected layout pattern or the ILT adjusted layout pattern is merged into the enhancement region, the OPC corrected layout pattern or the ILT adjusted layout pattern may not match with a surrounding of the enhancement region and generates mask rule check (MRC) violations in some embodiments. Therefore, when merging the OPC corrected layout pattern or the ILT adjusted layout pattern in the enhancement region, it is desirable to have intermediate zones between the enhancement region and the surrounding of the enhancement region such that the OPC corrected layout pattern or the ILT adjusted layout pattern gradually changes in the intermediate zones between the OPC corrected layout pattern or the ILT adjusted layout pattern of the enhancement region to the layout pattern of the surrounding.

FIG. 1 illustrates a schematic diagram of an exemplary integrated circuit (IC) fabrication flow 100. The IC fabrication flow 100 begins with an IC design module 102 that provides layout patterns M, e.g., target layout patterns, that will be produced as a resist pattern of an IC product on the wafer. The IC design module 102 generates various layout shapes, e.g., geometrical patterns, based on the specification of the IC product for different steps of processing the IC product. In some embodiments, the layout patterns M are presented by one or more data files having the information of the geometrical patterns. In some embodiments, optically projecting the layout pattern of the photo mask to the wafer in the lithographic process degrades the layout pattern of the photo mask and generates pattern defects on the resist material layer on the wafer. An OPC operation may be applied to the layout pattern of the photo mask to reduce pattern defects on the wafer. The OPC may modify the layout patterns of the photo mask to compensate for the effect of the lithography and/or etching processes. The IC fabrication flow 100 also shows a mask enhancer 104. As will be described in more detail below with respect to FIG. 2A, the mask enhancer 104 performs the OPC operation in some embodiments. The mask enhancer 104 creates an OPCed (e.g., a corrected or enhanced) layout pattern M' of the photo mask. In some embodiments, the enhanced layout pattern M' is presented by one or more data files having the information of the enhanced geometrical patterns.

The IC fabrication flow 100 further shows a mask projection system 106. In some embodiments, the mask projection system 106 produces the enhanced layout patterns M' on the photo mask. In some embodiments, the mask projection system 106 performs two functions. As a first function, the mask projection system 106 uses the data files of the enhanced layout pattern M' and uses an electron beam to generate the enhanced layout pattern M' on a mask blank (not shown) to produce the photo mask for the ICs. In addition, and as a second function, the mask projection system 106 optically projects the enhanced layout pattern M' of the photo mask on the wafer 108 to produce the IC patterns on the wafer 108.

Figure 2A:
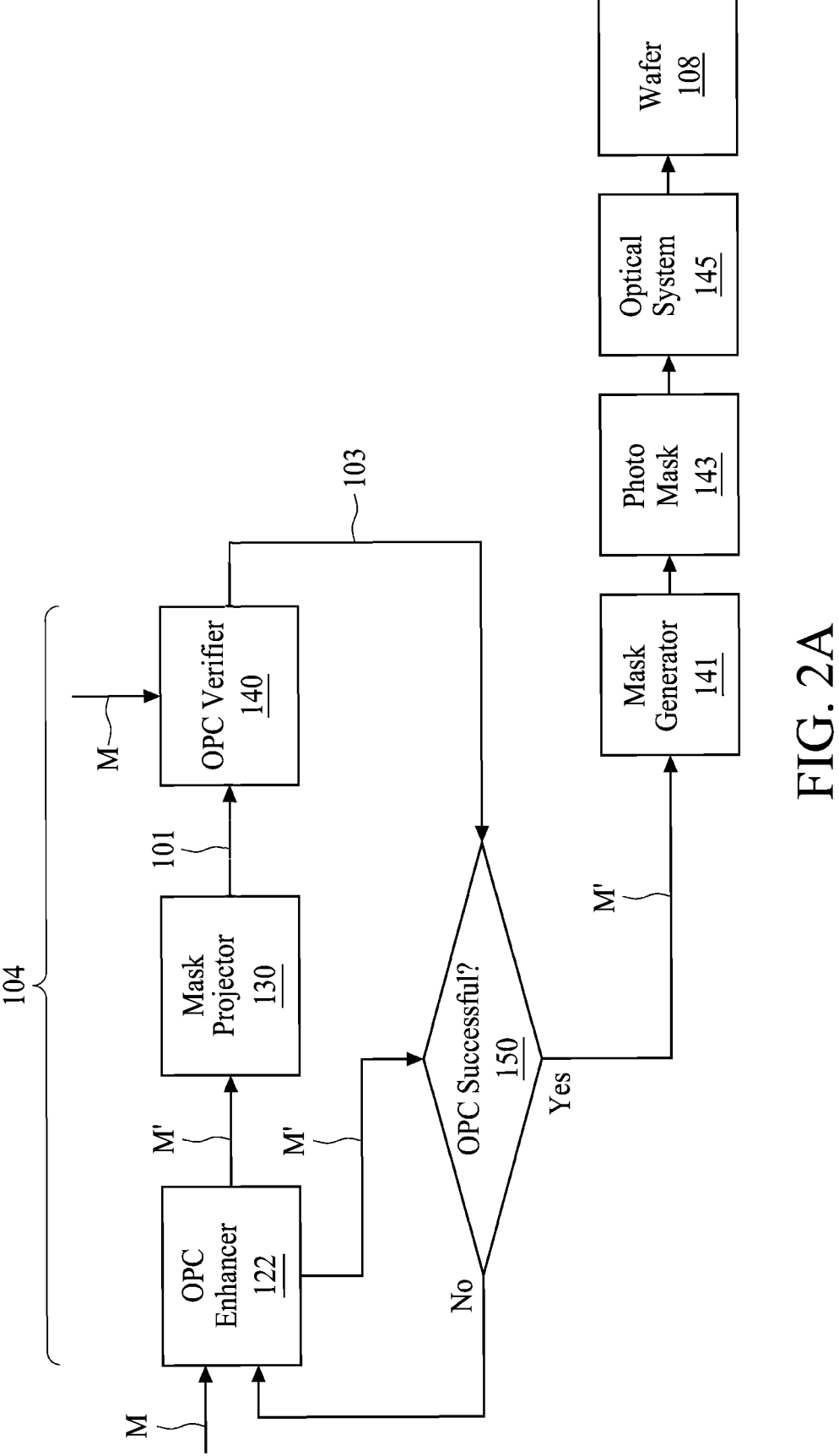
FIGS. 2A and 2B illustrate a schematic diagram of an exemplary mask enhancer and an OPC enhanced layout pattern associated with a target layout pattern.
Figure 2B:
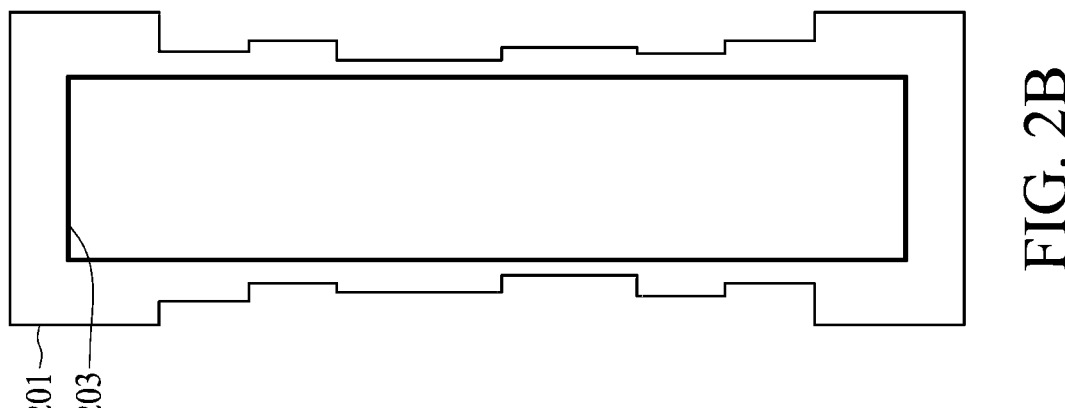

FIGS. 2A and 2B illustrate a schematic diagram of an exemplary photo mask enhancer and an OPC enhanced layout pattern associated with a target layout pattern. FIG. 2A illustrates a schematic diagram of the mask enhancer 104 that receives the target layout pattern M at an input of an OPC enhancer 122 and produces the enhanced layout pattern M' at an output of operation 150. The mask enhancer 104 performs an iterative process. In some embodiments, the mask enhancer 104 includes an OPC enhancer 122 that receives, from the IC design module 102, the target layout pattern M that will be produced on the wafer 108. The OPC enhancer 122 performs enhancements on the target layout pattern M and produces the OPCed (e.g., the corrected or enhanced) layout pattern M'.

As described, OPC is a lithography technique that is used to correct or enhance the layout pattern M and to add improved imaging effects to a target layout pattern M such that the OPCed layout pattern M' reproduces, on the wafer 108, the target layout pattern M. For example, OPC is used to compensate for imaging distortions due to optical diffraction. In some embodiments, the target layout pattern M is a data file having the information of the geometrical patterns to be produced on the wafer 108, and the OPC enhancer 122 modifies the data file and produces a corrected data file representing the enhanced layout pattern M'. In some embodiments, the target layout pattern M and the enhanced layout pattern M' are represented by the vertices of the layout patterns in the data files. Thus, in some embodiments, the rounded corners and the bends are represented by a curvilinear shape having multiple vertices and multiple line segments connecting the vertices and the curvilinear shape are represented by the multiple vertices in the data file. In some embodiments, the mask enhancer 104 of FIG. 2A is used for creating the OPC corrected layout pattern of FIGS. 7A, 7B, and 7C.

FIG. 2A further shows a mask projector 130, e.g., a simulator for mask projection, that is applied to the enhanced layout pattern M' to produce a projected resist pattern 101 on the wafer. In some embodiments, the enhanced layout pattern M' is a data file and the mask projector 130 simulates the projection of the enhanced layout pattern M' on the wafer and produces the simulated projected resist pattern 101. The projected resist pattern 101 is inspected by an OPC verifier 140 for defects. In some embodiments, the OPC verifier 140 receives the target layout pattern M in addition to the projected resist pattern 101 and compares the projected resist pattern 101 with the target layout pattern M to find errors between target layout pattern M and the projected resist pattern 101. In some embodiments, the OPC verifier 140 verifies the enhanced, e.g., OPCed, layout pattern M' when the error between the target layout pattern M and the projected resist pattern 101 is below a threshold level and there are no defects, e.g., a bridge or narrowing shown in FIG. 5, in the projected resist pattern. In some embodiments, after verifying the enhanced layout pattern M', the OPC verifier 140 generates and sends a verification signal 103. In some embodiments, the OPC verifier 140 stores the enhanced layout pattern M' in a database. In some embodiments, instead of a simulated result, a photo resist pattern is formed by using a photo mask fabricated with the enhanced layout pattern M' and the shapes and dimensions of the resist patterns are measured and are fed back to the OPC enhancer.

The verification signal 103 is tested at operation 150 and if the verification signal 103 is not successful, e.g., defects exist in the projected resist pattern 101, iterations continue by applying further OPC enhancements by the OPC enhancer 122. The iterations continue until the verification signal 103 is successful, or a predefined maximum number of iterations is reached. When the verification signal 103 is successful, the enhanced layout pattern M' is provided as the output of the mask enhancer 104.

As shown, in addition to the mask enhancer 104, FIG. 2A includes a mask generator 141 and an optical system 145. In some embodiments, the enhanced layout pattern M' is sent as a data file to the mask generator 141. The mask generator 141 produces the enhanced layout pattern M' on a mask blank to generate a photo mask 143. In some embodiments, the photo mask 143 is used by the optical system 145 of a photo lithography system to produce a resist pattern on a resist material layer of the wafer 108.

FIG. 2B illustrates the target layout patterns 203 and the OPC enhanced, e.g., corrected, layout patterns 201 of a connection line. In some embodiments, the OPC enhanced layout patterns 201 of FIG. 2B is formed on a photo mask and the photo mask is projected onto the wafer 108 by the mask projection system 106 of FIG. 1.

Figure 3A:
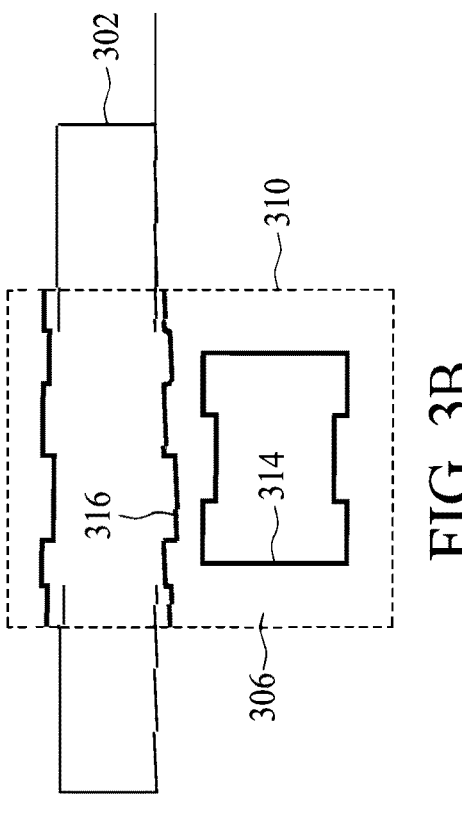
FIGS. 3A, 3B, and 3C illustrate an enhancement region of a layout pattern and an OPC enhanced layout pattern of the enhancement region.
Figure 3B:
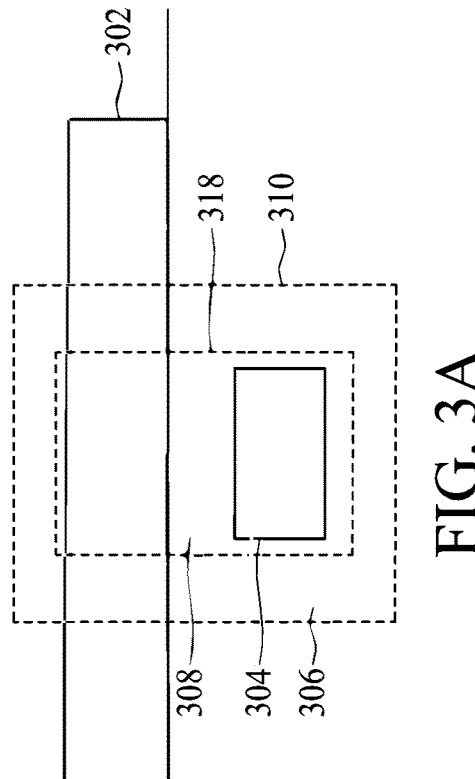
Figure 3C:
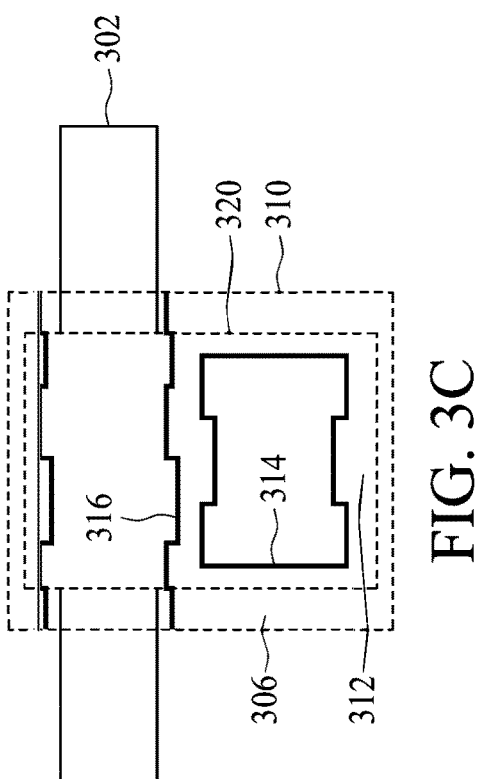

FIGS. 3A, 3B, and 3C illustrate an enhancement region of a layout pattern and an OPC enhanced layout pattern of the enhancement region. FIG. 3A shows two sub-patterns 302 and 304 of a layout pattern of a photo mask and a simulation zone 306 having a simulation zone boundary 310. The simulation zone 306 includes (e.g., encloses) an enhancement region 308 having an enhancement region boundary 318. In some embodiments, the two sub-patterns 302 and 304 when projected on the wafer 108 generate a defect. In some embodiments, the two sub-patterns 302 and 304 when projected on the wafer 108 generate a narrowing in one or both of the projected sub-patterns 302 and 304 in a region of the wafer 108 corresponding the enhancement region 308.

FIG. 3B shows OPC corrected layout patterns 314 and 316 that are generated in the simulation zone 306. In some embodiments, the OPC corrected layout patterns 314 and 316 are produced by the photo mask enhancer of FIG. 2A. As shown in FIG. 3B, the OPC corrected layout pattern 316 do not match with the sub-patterns 302 and generates a mask rule check (MRC) violation.

FIG. 3C shows the OPC corrected layout patterns 314 and 316 in the simulation zone 306. FIG. 3C also includes an intermediate zone 312 having an intermediate zone boundary 320 that is enclosed by the simulation zone boundary 310. In some embodiments, the intermediate zone 312 includes and encloses the enhancement region 308 (not shown). In the region between the simulation zone boundary 310 and the intermediate zone boundary 320, both the OPC corrected layout pattern 316 and the sub-pattern 302 are displayed. In some embodiments, the layout pattern of the photo mask is adjusted such that inside the intermediate zone 312, the OPC corrected layout pattern 316 is selected. Outside the simulation zone 306 the sub-pattern 302 is selected. And between the simulation zone boundary 310 and the intermediate zone boundary 320 a weighted sum of the sub-pattern 302 and the OPC corrected layout pattern 316 is selected such that no MRC violation is generated. Matching the OPC corrected layout pattern 316 and the sub-pattern 302 is described in more details with respect to FIGS. 7A, 7B, and 7C.

Figure 4:
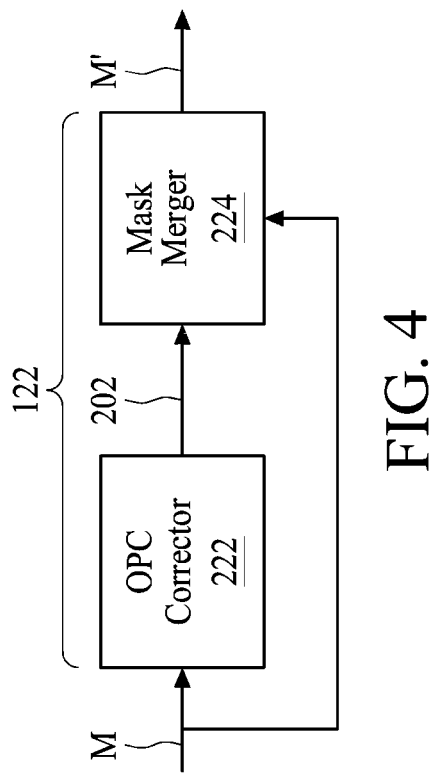
FIG. 4 illustrates an OPC enhancer of the mask enhancer in accordance with some embodiments of the disclosure.

FIG. 4 illustrates an OPC enhancer of the mask enhancer in accordance with some embodiments of the disclosure. The OPC enhancer 122 of the mask enhancer 104 includes an OPC corrector 222 and a mask merger 224. In some embodiments, the OPC corrector 222 performs an OPC operation inside a simulation zone, e.g., simulation zone 306 of FIG. 3A, that includes enhancement regions, e.g., the enhancement region 308, and generates the OPC corrected layout patterns 314 and 316 in the simulation zone. As noted, in some embodiments, the layout pattern is divided into the plurality of enhancement regions and the OPC operation is applied to each enhancement region. The OPC enhancer 122 of the mask enhancer 104 also includes a mask merger 224. The mask merger 224 receives OPC corrected layout patterns 202 that are consistent with the OPC corrected layout patterns 314 and 316 from the OPC corrector 222 and merges the OPC corrected layout patterns 202 into the target layout pattern M of the photo mask 143. In some embodiments, the target layout pattern M is divided two or more enhancement regions. The OPC corrector 222 performs the OPC operation inside two or more simulation zones corresponding with the two or more enhancement regions and the mask merger 224 merges two or more OPC corrected layout patterns 202 into the target layout pattern M. Matching the OPC corrected layout patterns is described in more details with respect to FIGS. 7A, 7B, and 7C.

Figure 5:
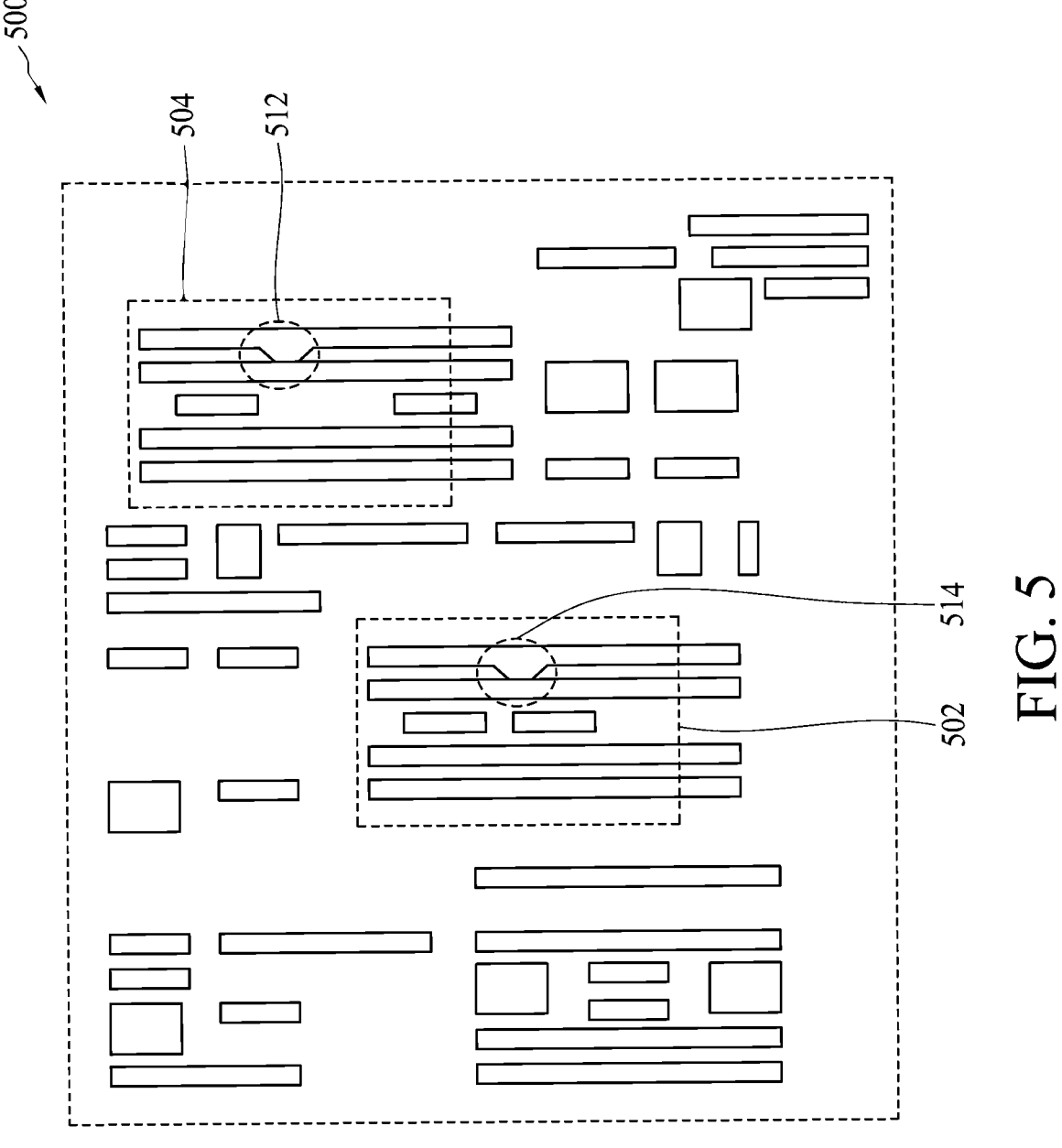
FIG. 5 illustrates exemplary contours of a resist pattern having two defective areas.

FIG. 5 illustrates exemplary layout contours having two defective areas. FIG. 5 shows the resist pattern 500 having two defective areas 502 and 504. The resist pattern 500 may be produced by the mask projector 130 when the corrected layout pattern M', after being OPCed, is projected on the resist material layer of the wafer 108, disclosed herein. As shown, both of the defective areas 502, 504 respectively include a bridging 512 and a bridging 514 (e.g., short circuits) that are connections between adjacent layout lines in the middle of the defective areas 502 and 504. In some embodiments, the defective areas 502 and 504 are back projected to two corresponding enhancement regions in the corrected layout pattern M'. In some embodiments, each one of the defective areas 502 and 504 are back projected into a corresponding hotspot region that is a portion the corresponding enhancement region such that the corresponding enhancement region includes the corresponding hotspot region. In some embodiments, the ILT operation is performed on the OPC corrected layout pattern M', e.g., on the enhancement regions that include the hotspot regions in the corrected layout pattern M', to further enhance the corresponding defective areas 502 and 504 of the resist pattern produced in the resist material layer of the wafer 108.

Figure 6A:
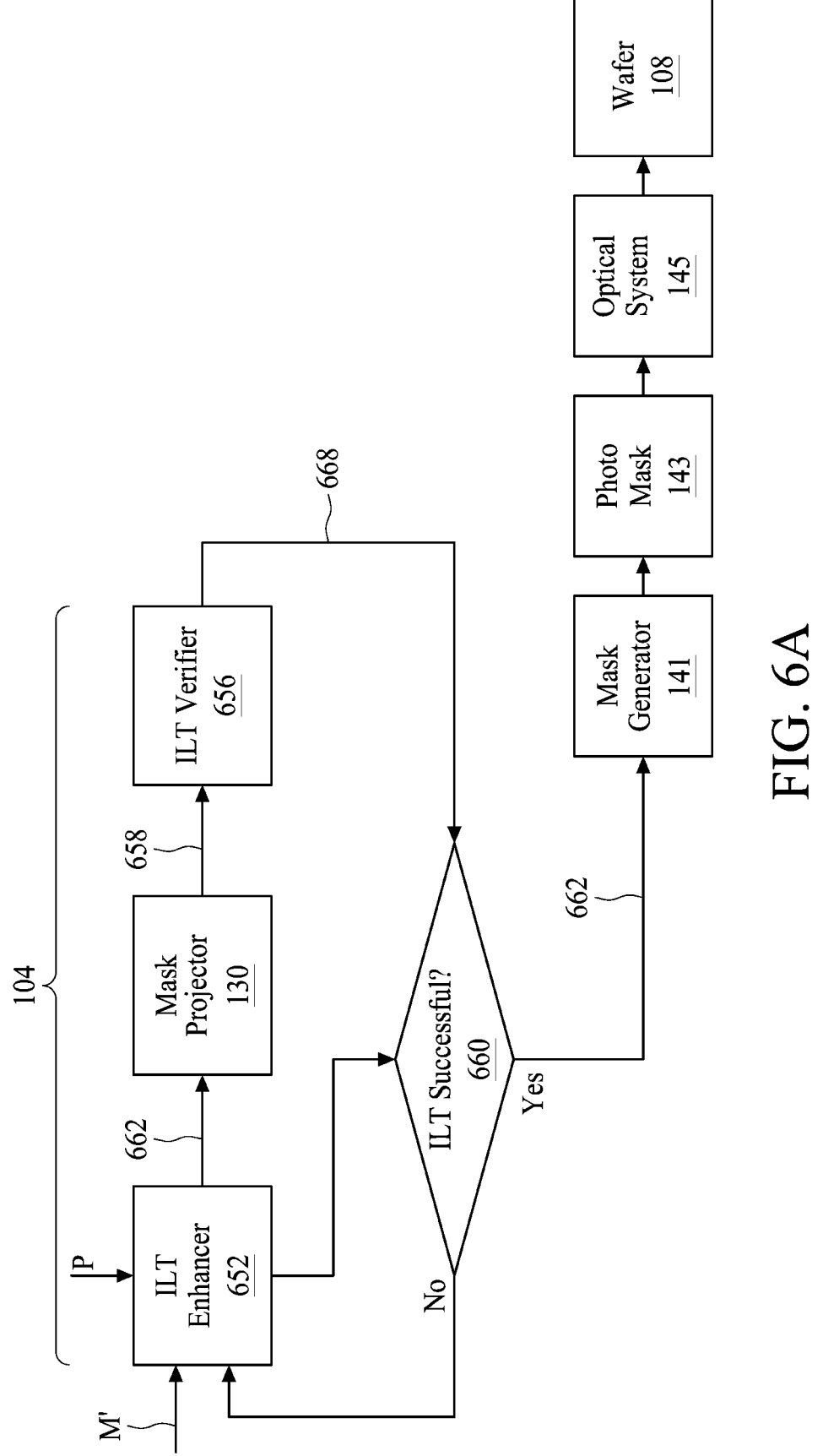
FIGS. 6A, 6B, and 6C illustrate schematic diagrams of a layout enhancer.
Figures 6B, 6C:
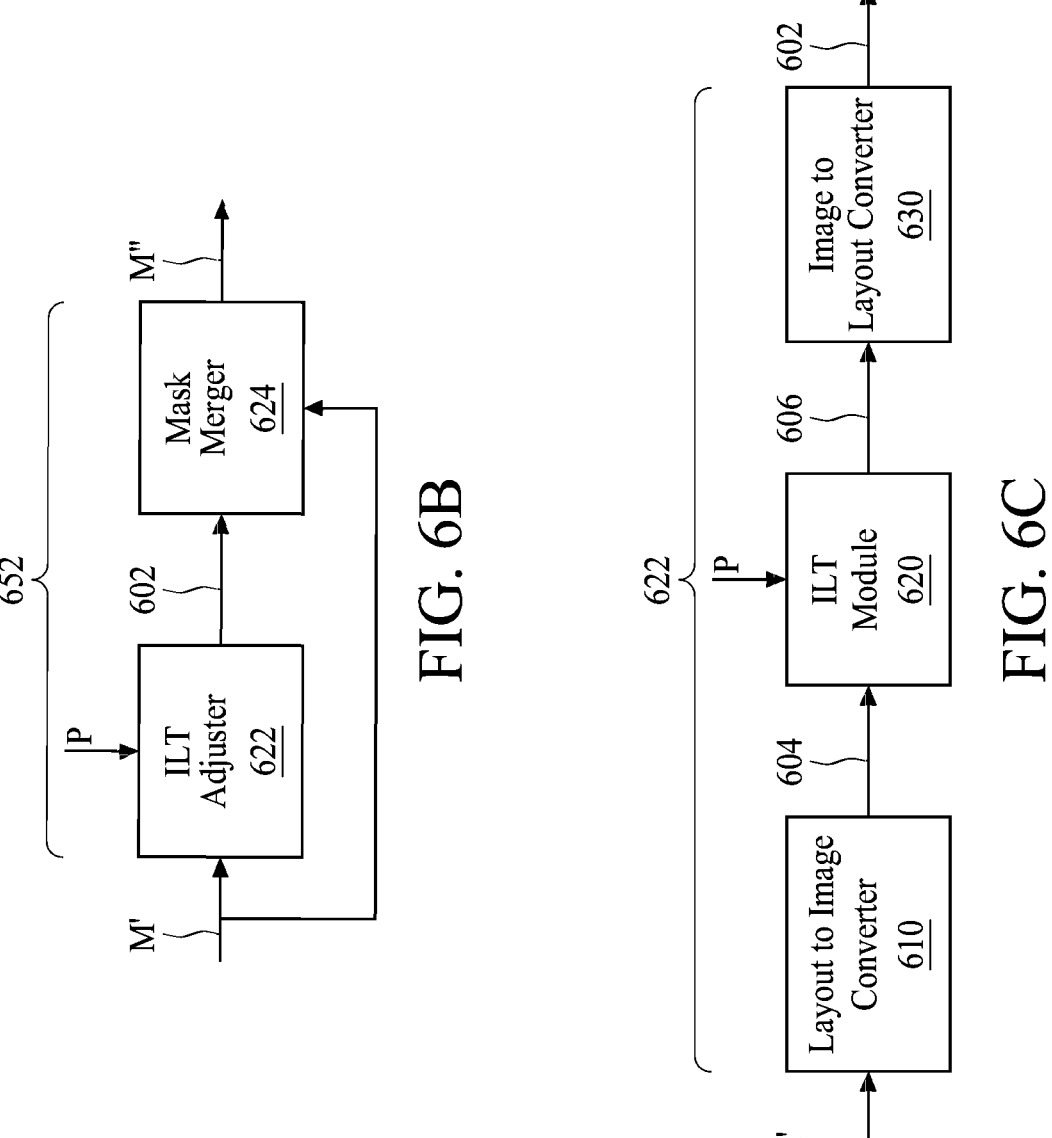

FIGS. 6A, 6B, and 6C illustrate schematic diagrams of a layout enhancer. FIG. 6A performs an ILT enhancement. FIG. 6A shows the mask enhancer 104 that receives the corrected layout pattern M', after the OPC operation, at an input of an ILT enhancer 652 and produces an enhanced layout pattern 662 at an output of the operation 660. In some embodiments, the ILT enhancer 652 receives the target layout pattern M and performs the ILT enhancement, e.g., the ILT enhancement operation, on the layout pattern M before without performing the OPC operation. Either the corrected layout pattern M' or the target layout pattern M includes an enhancement region corresponding to a defective area 502 or 504 on the resist material layer when the corrected layout pattern M' or the target layout pattern M is projected on the resist material layer of the wafer 108. As shown in FIG. 6A, the ILT enhancer 652 also receives the enhancement parameters P. In some embodiments, the enhancement parameters P include the constraints of the ILT enhancement operation. The ILT enhancer 652 and the enhancement parameters P are also described with respect to FIGS. 6B and 6C.

The ILT enhancer 652 performs an enhancement, e.g., a constrained inverse imaging operation, on the enhancement region of the corrected layout pattern M' or on the target layout pattern M and produces the iteration result, the enhanced layout pattern 662. The enhanced layout pattern 662 is projected by the mask projector 130 on the resist material layer of the wafer 108 to create a projected resist pattern 658. The projected resist pattern 658 is inspected by an ILT verifier 656 for defective areas. A verification outcome 668 is tested at operation 660 and if the verification outcome 668 is not successful, e.g., one or more defective areas exist, the iterations continue by modifying the enhancement parameters P at the ILT enhancer 652. The iterations continue until the verification outcome 668 is successful and the projected resist pattern 658 does not include any defective areas, or the predefined maximum number of iterations is reached. When the verification outcome 668 is successful, the enhanced layout pattern is provided at operation 660. In some embodiments, the predefined maximum number of iterations is between 5 and 100. In some embodiments, the enhancement parameters P include or define the constraints of the constrained inverse imaging operation such that the enhanced layout pattern 662 should not be smaller than a lower value, e.g., should not be less than zero; the enhanced layout pattern 662 should be limited to an upper value; and the width/length of a region of the enhanced layout pattern 662 should not be smaller than a predefined value, e.g., 10 pixels. In some embodiments, an error value is defined, after each iteration, based on the enhancement parameters P. In some embodiments, the error value is defined by summing the squared values of the enhanced layout pattern 662 at the points that enhancement parameters P are not satisfied.

As shown, in addition to the mask enhancer 104, FIG. 6A includes the mask generator 141 and an optical system 145. A described above, the mask generator 141 generates the photo mask 143 from the enhanced layout pattern 662 and the optical system 145 of the photo lithography system projects the photo mask 143 and produces the resist pattern on the resist material layer of the wafer 108. In some embodiments, the OPC operations are performed on the entire enhancement regions, however, the ILT enhancement is performed on the enhancement regions that include one or more hotspot regions.

FIG. 6B illustrates the ILT enhancer 652 of the mask enhancer 104. The ILT enhancer 652 includes an ILT adjuster 622 and a mask merger 624. In some embodiments, the ILT adjuster 622 performs an ILT operation inside a simulation zone, e.g., simulation zone 306 of FIG. 3A, that includes enhancement regions, e.g., the enhancement region 308, and generates an ILT adjusted layout pattern in the simulation zone. In some embodiments, as defined earlier, an enhancement region includes one or more hotspot regions. The mask merger 624 receives the ILT adjusted layout patterns 602 from the ILT adjuster 622 and merges the ILT adjusted layout patterns 602 into the target layout pattern M of the photo mask 143. In some embodiments, before the ILT operation, the OPC operation is performed on the target layout and, thus, the input to the ILT enhancer 652 is the corrected layout pattern M'. In some embodiments, the target layout pattern M includes two or more enhancement regions. The ILT adjuster 622 performs the ILT operation inside a simulation zone corresponding with the two or more enhancement regions and the mask merger 624 merges two or more ILT adjusted layout patterns 602 into the corrected layout pattern M". Matching the ILT adjusted layout patterns is described in more details with respect to FIGS. 7A, 7B, and 7C.

FIG. 6C illustrates the ILT adjuster 622 of the ILT enhancer 652. The ILT adjuster 622 includes a layout to image converter 610 that receives a layout pattern, e.g., the target layout pattern M and converts the layout pattern into a grey scale image. In some embodiments, as shown in FIG. 1, the shapes of the layout pattern are displayed by a dark color (e.g., black color) and the space between the shapes are displayed by a bright color (e.g., white color) and a grey scale image 604 is generated. The ILT adjuster 622 also includes an ILT module 620 and an image to layout converter 630. The ILT module 620 receives the grey scale image 604 and performs a constrained inverse imaging operation, e.g., a constrained inverse filtering operation, on the grey scale image 604 and produces an enhanced image 606. In some embodiments, each operation of the ILT module 620 is iterative based on the error value described above such that the ILT module 620 minimizes the error value by a gradient descent algorithm, a steepest descent algorithm. Therefore, after each operation of the ILT module 620, the error values are minimized based on the enhancement parameters P. The image to layout converter 630 receives the enhanced image 606 and generates the ILT adjusted layout patterns 602. In some embodiments, the image to layout converter 630 performs image processing operations to generate the ILT adjusted layout patterns 602 that includes one or more curvilinear shapes. Each curvilinear shape includes multiple vertices and multiple line segments connecting the vertices. The curvilinear shapes are represented by the multiple vertices in a data file of the ILT adjusted layout patterns 602.

Figure 7A:
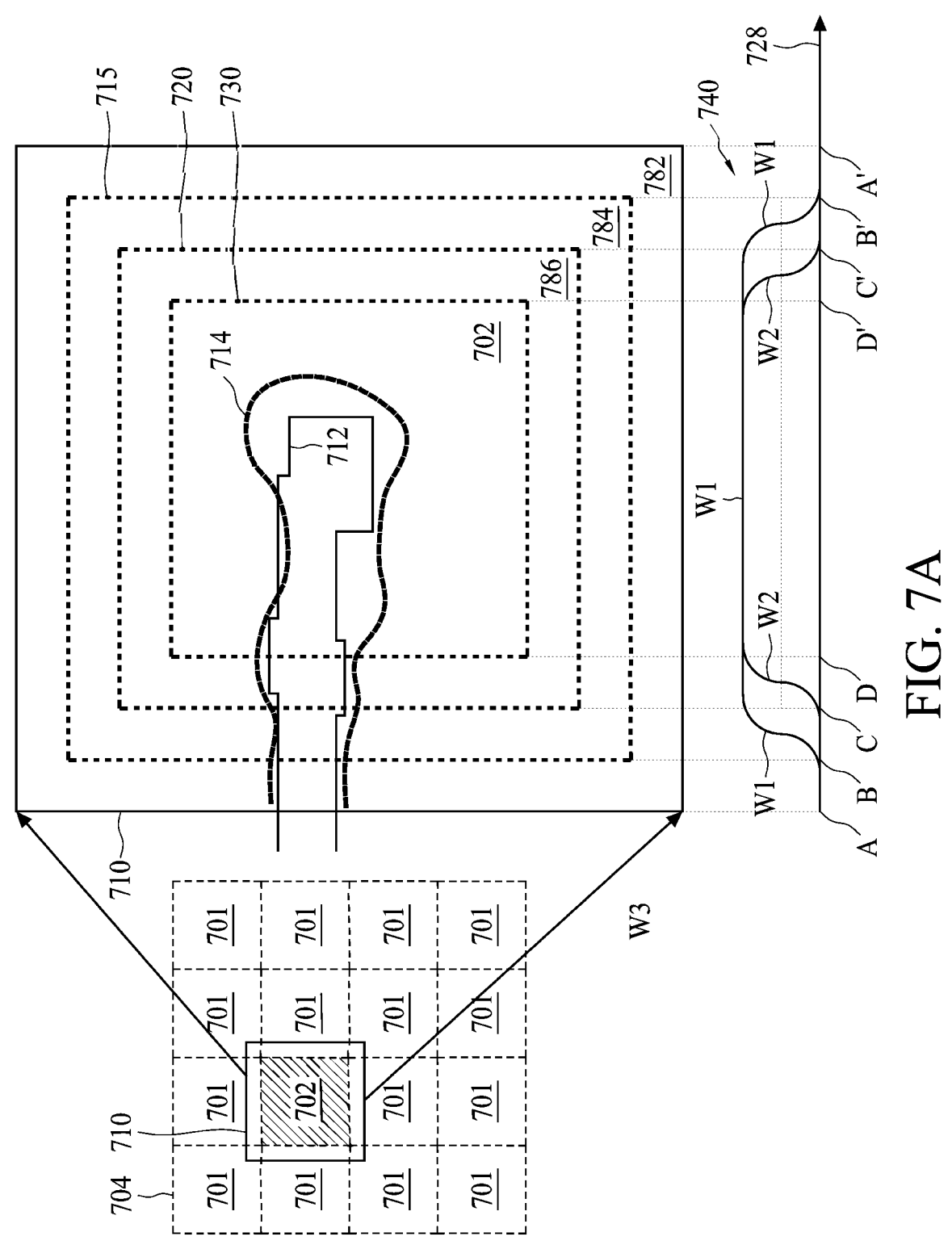
FIGS. 7A, 7B, and 7C illustrate exemplary target layout patterns, enhanced layout patterns, and merging the enhanced layout patterns into the target layout patterns.
Figures 7B, 7C:
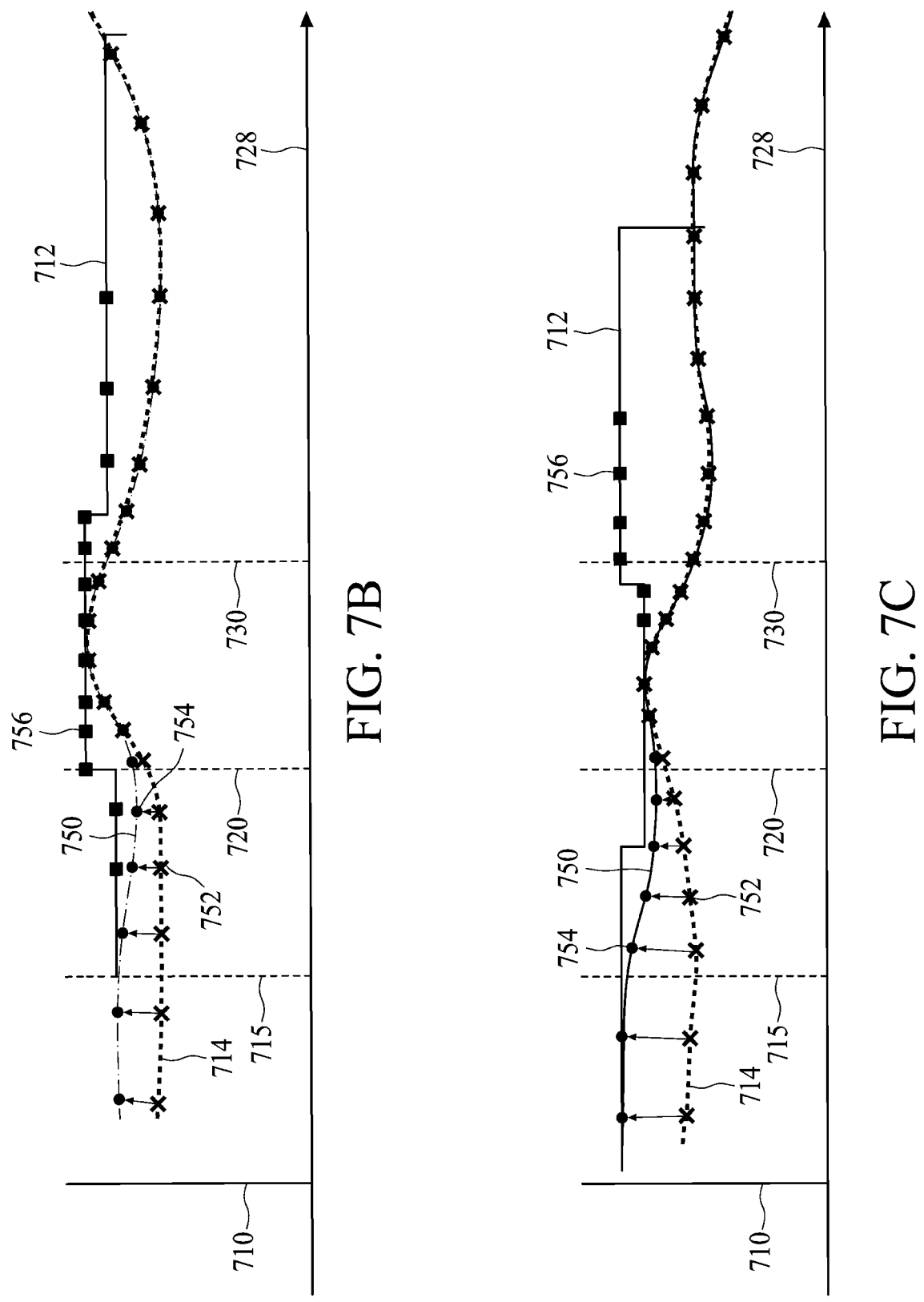

FIGS. 7A, 7B, and 7C illustrate exemplary target layout patterns, enhanced layout patterns, and merging the enhanced layout patterns into the target layout patterns. FIG. 7A shows a section of a semiconductor circuit that includes two or more tiles. In some embodiments, the semiconductor circuit is in a die 704 that includes a plurality of tiles 701 and 702 where each one is an enhancement region.

The enhancement region 702 is described in more detail in FIG. 7A. The enhancement region 702 is a tile and the boundary 730 is the boundary of the enhancement region 702. As shown in FIG. 7A, a simulation zone 782 with the boundary 710 is selected around the enhancement region 702 such that the enhancement region 702 is inside the simulation zone 782 and the simulation zone 782 extends beyond the enhancement region 702 into the neighboring tiles 701. In some embodiments, the OPC operation and/or the ILT operation is performed inside the simulation zone 782. As shown in FIG. 7A, a layout pattern 712, e.g., an initial layout pattern, is inside the simulation zone 782. In some embodiments, the layout pattern 712 includes a segment or multiple segments inside the enhancement region 702 that produces a defect when the layout pattern 712 is projected on a wafer.

As shown in FIG. 7A, the OPC operation and/or the ILT operation is applied inside the simulation zone 782 on the layout pattern 712. In some embodiments, the ILT operation is applied on the layout pattern 712 and the ILT adjusted layout pattern 714 is produced inside the simulation zone 782. As shown, the ILT adjusted layout pattern 714 does not match the layout pattern 712 that extends beyond the enhancement region 702 into a neighboring tile 701. In addition, the ILT adjusted layout pattern 714 does not match the layout pattern 712 that extends beyond the simulation zone 782 and produces MRC violations because of the jogs produced by the mismatch at the boundary if the ILT adjusted layout pattern 714 is used instead of the layout pattern 712 inside the simulation zone 782.

In some embodiments, a stitch mobility zone 784 is inside the simulation zone 782 and includes the enhancement region 702. Also, the boundary 710 of the simulation zone 782 encloses the stitch mobility zone 784. In addition, an optimization mobility zone 786 is inside the stitch mobility zone 784 and includes the enhancement region 702 such that a boundary 720 of the optimization mobility zone encloses the enhancement region 702. Also, the boundary 715 of the stitch mobility zone 784 encloses the optimization mobility zone 786.

In some embodiments and to avoid MRC violations, an enhanced layout pattern (not shown) is generated in the simulation zone 782. The enhanced layout pattern is generated by combining the ILT adjusted layout pattern 714 and the layout pattern 712. In some embodiments, a weighting function W1 is used for combining, e.g., stitching, the ILT adjusted layout pattern 714 and the layout pattern 712. A graph 740 on a distance coordinate 728 of FIG. 7A shows the weighting function W1 in each zone. In some embodiments, the weighting function W1 is one inside the optimization mobility zone 786, is zero outside the stitch mobility zone 784, and changes from zero to 1 from the boundary 715 of the stitch mobility zone 784 to the boundary 720 of the optimization mobility zone 786. In some embodiments, the enhanced layout pattern is a sum of the ILT adjusted layout pattern 714 multiplied by W1 and the layout pattern 712 multiplied by (1–W1).

In some embodiments, a second weighting function W2, which is a value between zero and 1, is used between the boundary 730 of the enhancement region and the boundary 720. The optimization mobility zone 786 is not directly part of the stitching process because the weighting function is one inside the optimization mobility zone 786. The weighting function W2 is used to scale the gradient in the ILT enhanced or the OPC corrected layout patterns. This is used to ensure that in the region where the stitching mobility field is between 0 and 1, the layout pattern change is minimized. In some embodiments, if the weighting function W1 is zero, then the only mask change is due to the layout to image converter 610 and image to layout converter 630 not being perfect inverses of each other.

As shown in FIG. 7A, the distance coordinate 728 shows the boundary 710 at points A and A', the boundary 715 at points B and B', the boundary 720 at points C and C', and the boundary 730 at point D and D'.

FIGS. 7B and 7C show the layout pattern 712, the ILT adjusted layout pattern 714, and the enhanced layout pattern 750 generated by a weighted sum of the layout pattern 712 and the ILT adjusted layout pattern 714. As shown, the layout pattern 712 includes a first plurality of vertices 756 and the ILT adjusted layout pattern 714 includes a second plurality of vertices 752. As shown, the enhanced layout pattern 750 includes a third plurality of vertices 754. In some embodiments, the third plurality of vertices 754 is generated as a weighted sum of the first plurality of vertices 756 and the second plurality of vertices 752 using the weighting function values of each zone shown by the graph 740. The zone boundaries 710, 715, 720, and 730 are also shown. In some embodiments, instead of applying the weighting function values to the vertices, the weighting function values are applied to one or more line segments between neighboring vertices. In some embodiments, the weighting function W1 is computed and applied to the center of the segment. In some embodiments, when performing Manhattan to Manhattan stitching, the segments are moved rather than vertices. In some embodiments, additional vertices are introduced in order to preserve the Manhattan edges rather than selecting the enhanced curvilinear output. In some embodiments, an OPC corrected layout pattern is used instead of the ILT adjusted layout pattern and the enhanced layout pattern is similarly produced.

Figure 8:
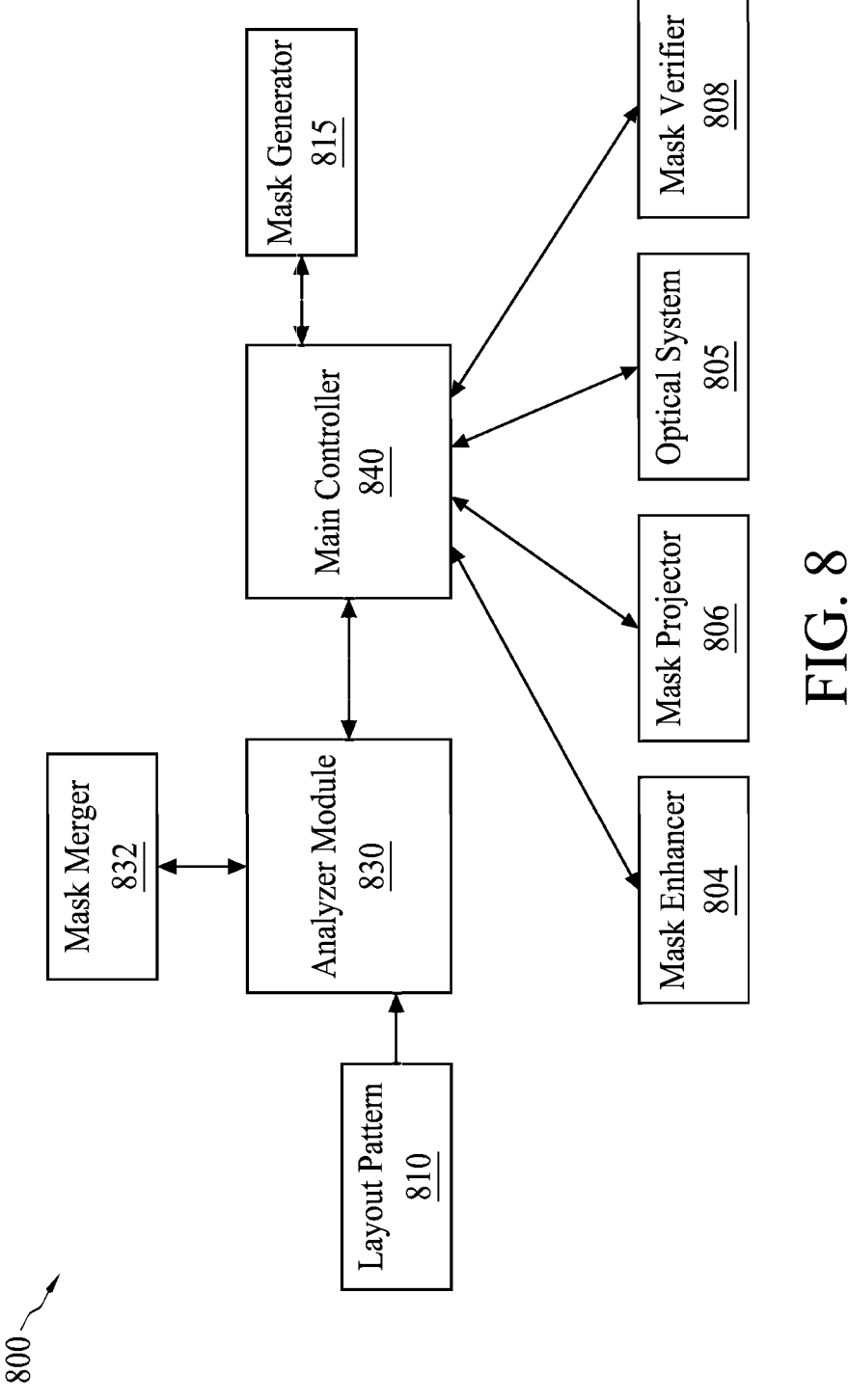
FIG. 8 illustrates an exemplary system of enhancing a target layout pattern of a photo mask in accordance with some embodiments of the disclosure.

FIG. 8 illustrates an exemplary system of enhancing a target layout pattern of a photo mask in accordance with some embodiments of the disclosure. The system 800 includes an analyzer module 830 and a main controller 840 coupled to each other. The analyzer module 830 receives the layout pattern 810, which is consistent with the target layout pattern M of FIGS. 1 and 2A. The analyzer module 830 may send the layout pattern 810 to a mask enhancer 804, consistent with the mask enhancer 104 of FIG. 1, that is coupled to the main controller 840. In some embodiments, the analyzer module 830 determines the enhancement regions of the target layout pattern M and performs an OPC operation and/or an ILT operation of the enhancement regions of the target layout pattern M. In some embodiments, the analyzer module 830 divides the entire target layout pattern M into a number of enhancement regions. The main controller 840 is also coupled to a mask projector 806, consistent with mask projector 130 of FIGS. 1 and 2A, an optical system 805, and a mask verifier 808. The mask verifier 808 is consistent with the OPC verifier 140 of FIG. 2A or the ILT verifier 656 of FIG. 6A. The optical system 805 is consistent with optical system 145 of FIGS. 2A and 6A. In some embodiments, the mask enhancer 804 performs the OPC and ILT operations on the layout pattern 810, e.g., performs the OPC and ILT on the enhancement regions. In some embodiments, instead of the mask enhancer 804, the analyzer module 830 performs the OPC and ILT operations on the enhancement regions of the layout pattern 810.

As shown in the system 800, the mask enhancer 804 is coupled to the analyzer module 830 through the main controller 840. In some embodiments, the mask enhancer 804 is consistent with the OPC enhancer 122 of FIG. 2A. In some embodiments, the mask enhancer 804 is consistent with the ILT enhancer 652 of FIG. 6A. The system 800 also includes a mask projector 806 that is coupled to the analyzer module 830 through the main controller 840. In some embodiments, the mask projector 806 is consistent with the mask projector 130 of FIGS. 2A and 6A. The system 800 further includes a mask verifier 808 that is coupled to the analyzer module 830 through the main controller 840.

In some embodiments, the analyzer module 830 requests the mask projector to provide a projection, e.g., a simulated projection, of the layout pattern 810 on a wafer. The analyzer module 830 inspects the projection of the layout pattern 810 on the wafer and determines one or more defects of the projection of the layout pattern 810. The analyzer module 830 further determines one or more enhancement regions corresponding to the defects of the layout pattern 810. In some embodiments, the mask enhancer 804, the mask projector 806, and the mask verifier 808 are included in the main controller 840. FIG. 8 also includes a mask generator 815 coupled to the main controller 840 that is consistent with the mask generator 141 of FIGS. 2A and 6A that generates a photo mask from a layout pattern. FIG. 8 further includes a mask merger 832 that is coupled to the analyzer module 830, which is consistent with the mask merger 224 and the mask merger 624 of FIGS. 4 and 6B.

FIG. 9 illustrates a flow diagram of an exemplary process for enhancing a target layout pattern of a photo mask in accordance with some embodiments of the disclosure. The process 900 may be performed by the system of FIGS. 2A and 6A. In some embodiments, the process 900 or a portion of the process 900 is performed and/or is controlled by the computer system 1000 described below with respect to FIGS. 10A and 10B. In some embodiments, the process 900 is performed by the system 800 of FIG. 8. The method includes an operation S902 where an enhancement region of a layout pattern in a simulation zone is determined. As described with respect to FIG. 8, the analyzer module 830 inspects the projection of the layout pattern 810 and determines one or more defects in the projection of the layout pattern 810. The analyzer module further determines enhancement regions of the layout pattern 810 corresponding to the defects. The analyzer module selects one enhancement region, e.g., the enhancement region 702 of FIG. 7A. The analyzer module further selects a simulation zone 782 having a boundary 710 surrounding the enhancement region 702, where the simulation zone 782 encloses the selected enhancement region 702.

In operation S904, a stitching mobility zone inside the simulation zone is determined. Also, an optimization mobility zone inside the stitching mobility zone is determined, or alternatively, the optimization mobility zone inside the simulation zone is determined. The optimization mobility zone encloses the selected enhancement region. As shown in FIG. 7A, the stitching mobility zone 784 having the boundary 715 inside the simulation zone 782 is defined. Also, the optimization mobility zone 786 having the boundary 720 is determined inside the stitching mobility zone 784. Also, the optimization mobility zone 786 encloses the enhancement region 702. In operation S906, an OPC operation of the layout pattern in the simulation zone is performed and an OPC corrected layout pattern is generated. As shown in FIG. 7A, the OPC operation is performed on the layout pattern 712 and the OPC corrected or the ILT adjusted layout pattern 714 is produced. In some embodiments, the operation S906 includes the OPC operation followed by the ILT operation. In operation S908, an enhanced layout pattern is generated by combining the OPC corrected, or alternatively, the OPC-ILT enhanced, layout pattern and the layout pattern using a weighted sum of the OPC corrected or the OPC-ILT enhanced layout pattern and the layout pattern. As shown in FIGS. 7B and 7C, the layout pattern 712 and the OPC corrected or the ILT adjusted layout pattern 714 are combined by a weighted sum and the enhanced layout pattern 750 is produced. The weighted sum is described with respect to FIGS. 7B and 7C. In operation S910, the enhanced layout pattern is formed on a mask blank. As shown in FIGS. 2A, the mask generator 141 forms the enhanced layout pattern M' on a mask blank to generate the photo mask 143.

Figure 10A:
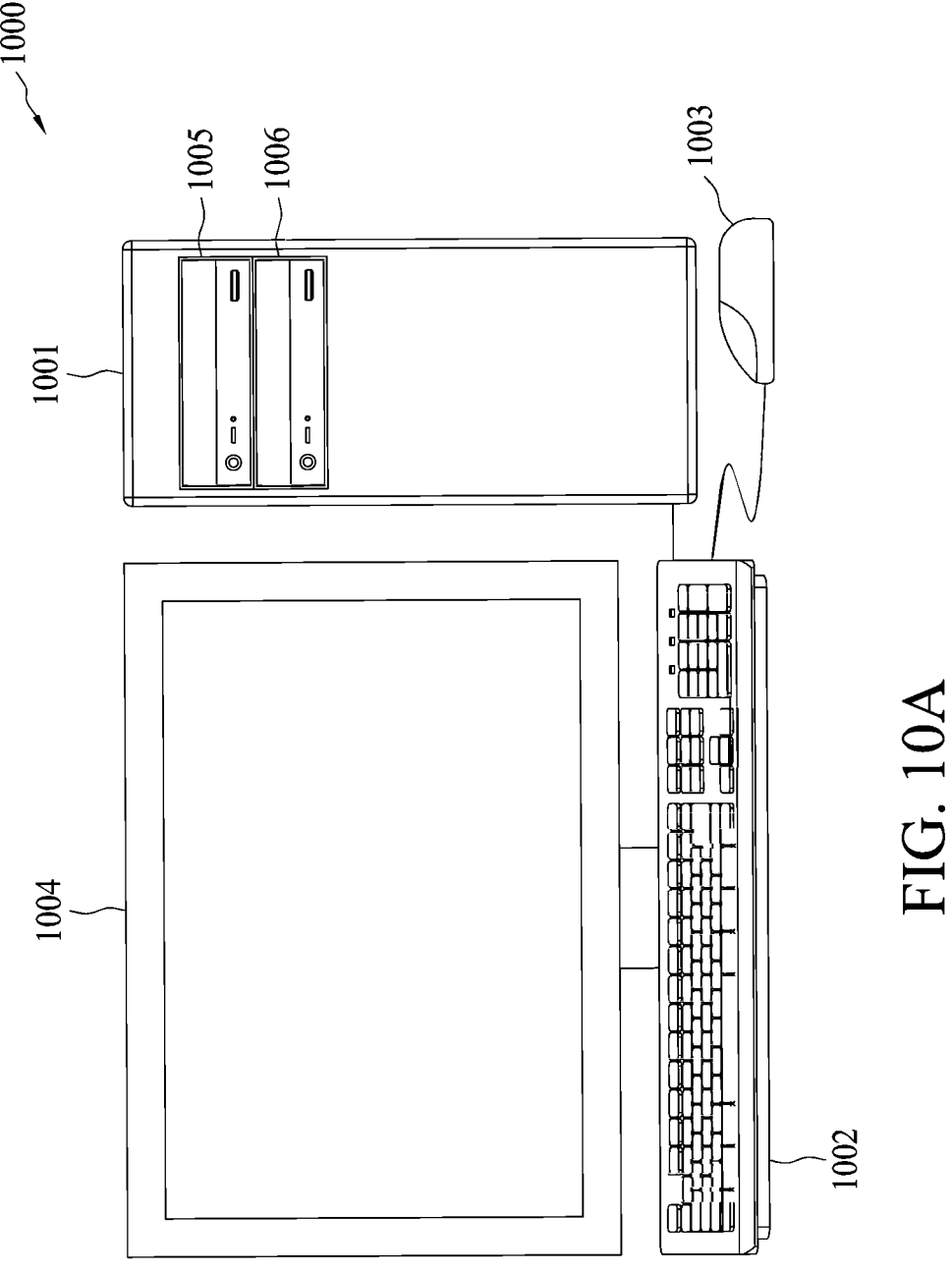
FIGS. 10A and 10B illustrate an apparatus for enhancing a photo mask in accordance with some embodiments of the disclosure.
Figure 10B:
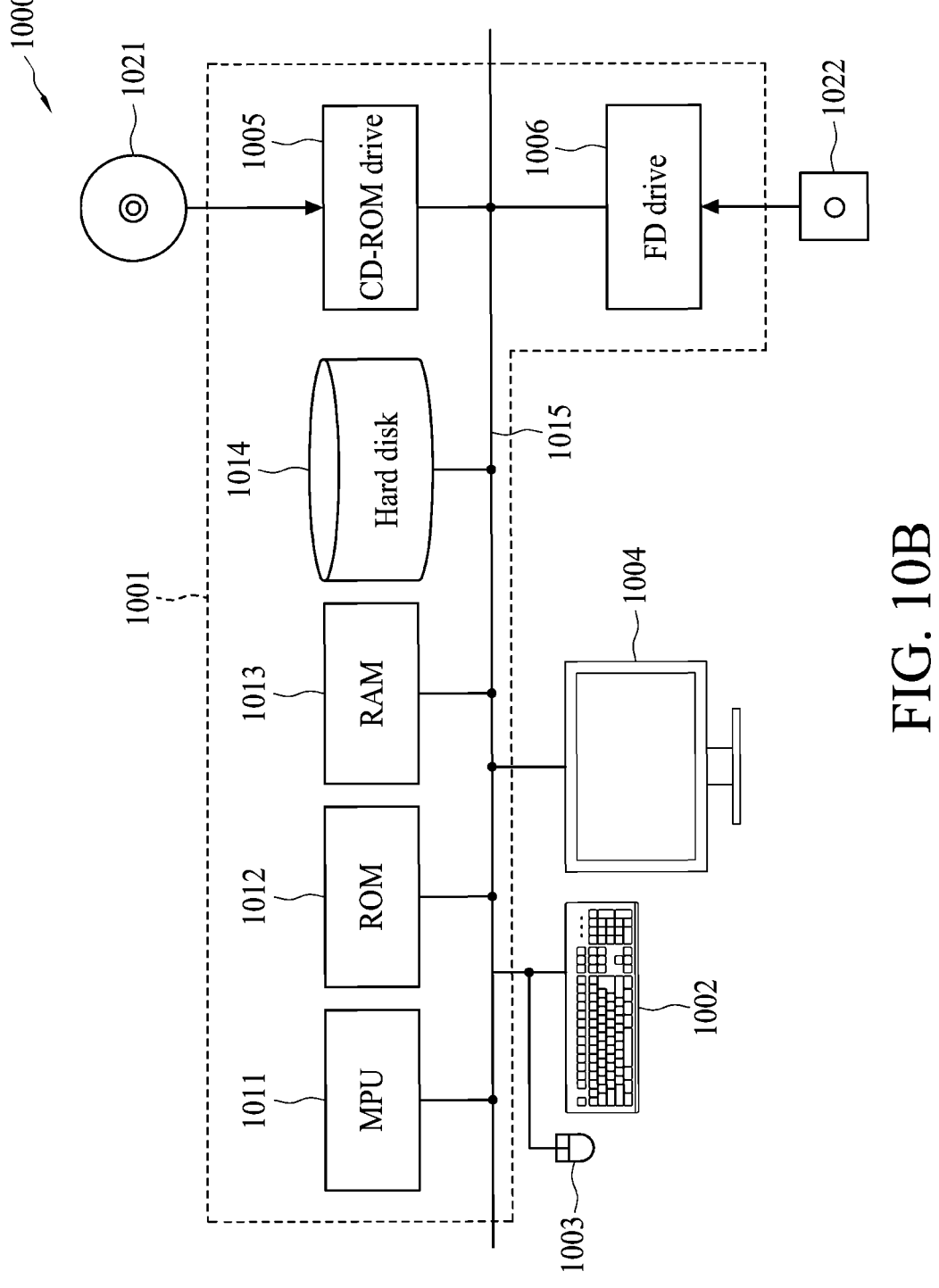

FIGS. 10A and 10B illustrate an apparatus for enhancing a photo mask in accordance with some embodiments of the disclosure. In some embodiments, the computer system 1000 is used for enhancing a photo mask. Thus, in some embodiments, the computer system 1000 performs the functions of the OPC enhancer 122, the mask projector 130, and the OPC verifier 140 of FIG. 2A. In some embodiments, as described in FIG. 8, the computer system 1000 performs the functions of the analyzer module 830, main controller 840, the mask enhancer 804, the mask projector 806, the optical system 805, and the mask verifier 808. FIG. 10A is a schematic view of a computer system that performs the enhancing of a photo mask. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions of an apparatus for performing the enhancement of a photo mask in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the photo mask enhancement apparatus in the foregoing embodiments. The program may only include a command portion to call an appropriate function (module) in a controlled mode and obtain desired results.

In some embodiments, the OPC correction and the ILT enhancement is performed in the enhancement regions. Merging the OPC correction and the ILT enhancement into the layout pattern of the photo mask generates one or more MRC violation that causes error in the projected pattern on the wafer. The method and system described above provides an efficient and accurate method to avoid MRC violation.

According to some embodiments of the present disclosure, a method of manufacturing a photo mask for a semiconductor device includes determining a first enhancement region, in a first simulation zone, of a layout pattern of a photo mask. The method includes determining a stitching mobility zone inside the first simulation zone. The first enhancement region is in the stitching mobility zone and the stitching mobility zone is enclosed inside a first boundary of the first simulation zone. The method also includes determining an optimization mobility zone inside the stitching mobility zone. The optimization mobility zone is enclosed inside a second boundary of the stitching mobility zone. The first enhancement region is in the optimization mobility zone, and a third boundary of the optimization mobility zone encloses a fourth boundary of the first enhancement region. The method further includes performing an optical proximity correction (OPC) operation of the layout pattern of the photo mask in the first simulation zone to generate an OPC corrected layout pattern in the first simulation zone. The method includes combining the OPC corrected layout pattern and the layout pattern in the first simulation zone to generate an enhanced layout pattern of the photo mask in the first simulation zone by: selecting the OPC corrected layout pattern inside the fourth boundary, selecting, based on a first weighting function, a weighted sum of the OPC corrected layout pattern and the layout pattern between the fourth boundary and the third boundary, selecting, based on a second weighting function, a weighted sum of the OPC corrected layout pattern and the layout pattern between the third boundary and the second boundary, and selecting the layout pattern between the second boundary and the first boundary. The method further includes forming the enhanced layout pattern on a mask blank. In an embodiment, the layout pattern includes a first plurality of vertices, the OPC corrected layout pattern includes a second plurality of vertices, and the enhanced layout pattern includes a third plurality of vertices, and the combining the OPC corrected layout pattern and the layout pattern in the first simulation zone further includes generating the third plurality of vertices based on the first plurality of vertices and the second plurality of vertices; and generating the enhanced layout pattern of the photo mask as curvilinear shapes having the third plurality of vertices and multiple line segments connecting corresponding vertices of the third plurality of vertices. In an embodiment, the generating the third plurality of vertices includes selecting, inside the fourth boundary, one or more vertices of the second plurality of vertices as one or more vertices of the third plurality of vertices of the OPC corrected layout pattern. The generating the third plurality of vertices includes selecting, between the fourth boundary and the third boundary, based on the first weighting function, a weighted sum of one or more of the second plurality of vertices of the OPC corrected layout pattern and corresponding one or more vertices of the first plurality of vertices of the layout pattern as the third plurality of vertices of the enhanced layout pattern. The generating the third plurality of vertices also includes selecting, between the third boundary and the second boundary, based on the second weighting function, a weighted sum of one or more of the second plurality of vertices of the OPC corrected layout pattern and corresponding one or more vertices of the first plurality of vertices of the layout pattern as the third plurality of vertices of the enhanced layout pattern. The generating the third plurality of vertices further includes selecting, between the second boundary and the first boundary, one or more vertices of the first plurality of vertices of the layout pattern as one or more vertices of the third plurality of vertices of the enhanced layout pattern. In an embodiment, the method further includes, determining a plurality of enhancement regions of the layout pattern of the photo mask, determining the first enhancement region from the plurality of enhancement regions, and determining the first simulation zone from the plurality of simulation zones. The first enhancement region is inside the first simulation zone. In an embodiment, the method further includes generating enhanced layout patterns of the photo mask in two or more simulation zones of the plurality of simulation zones different from the first simulation zone. In an embodiment, the first and second weighting functions are selected to avoid generating a mask rule violation and prior to the forming the enhanced layout pattern on the mask blank, performing an ILT operation of the enhanced layout pattern in the first simulation zone.

According to some embodiments of the present disclosure, a method of manufacturing a photo mask for a semiconductor device includes determining a first enhancement region, in a first simulation zone, of a layout pattern of a photo mask. The method includes determining a stitching mobility zone inside the first simulation zone. The first enhancement region is in the stitching mobility zone and the stitching mobility zone is enclosed inside a first boundary of the first simulation zone. The method includes determining an optimization mobility zone inside the stitching mobility zone. The optimization mobility zone is enclosed inside a second boundary of the stitching mobility zone, the first enhancement region is in the optimization mobility zone, and a third boundary of the optimization mobility zone encloses a fourth boundary of the first enhancement region. The method also includes performing an inverse lithographic transformation (ILT) operation of the layout pattern of the photo mask in the first simulation zone to generate an ILT adjusted layout pattern in the first simulation zone. The method further includes combining a weighted sum of the ILT adjusted layout pattern and the layout pattern in the first simulation zone to generate an enhanced layout pattern of the photo mask in the first simulation zone using: a first weighting function inside the fourth boundary, a second weighting function between the fourth boundary and the third boundary, a third weighting function between the third boundary and the second boundary, and a fourth weighting function between the second boundary and the first boundary. The method also includes forming the enhanced layout pattern on a mask blank. In an embodiment, the method further includes that prior to the performing the ILT operation on the layout pattern generating a first image based on the layout pattern in the first simulation zone, performing the ILT operation on the first image to generate an ILT enhanced image in the first simulation zone, and generating a curvilinear shape based on the ILT enhanced image as the ILT adjusted layout pattern. In an embodiment, a layout pattern of a first enhancement region includes a hotspot region that generates a defective area when the layout pattern of the photo mask is projected on a wafer, and the enhanced layout pattern of the first enhancement regions does not generate a defective area when projected on the wafer. In an embodiment, projecting the layout pattern and the enhanced layout pattern on the wafer is a simulated projection. In an embodiment, the defective area on the wafer includes a pinching, a bridging, or both. In an embodiment, prior to the performing the ILT operation of the layout pattern in the first simulation zone, performing an optical proximity correction (OPC) operation of the layout pattern in the first simulation zone. In an embodiment, the layout pattern includes a first plurality of vertices, the ILT adjusted layout pattern includes a second plurality of vertices, the enhanced layout pattern includes a third plurality of vertices, and combining the ILT adjusted layout pattern and the layout pattern in the first simulation zone further includes generating the third plurality of vertices based on the first plurality of vertices and the second plurality of vertices, and generating the enhanced layout pattern of the photo mask as curvilinear shapes having the third plurality of vertices and multiple line segments connecting corresponding vertices of the third plurality of vertices. In an embodiment, each one of the first, the second, the third, and the fourth weighting functions includes a weight value W greater or equal to zero and smaller or equal to one. Combining the weighted sum of the ILT adjusted layout pattern and the layout pattern includes determining each one of the third plurality of vertices as a weighted sum of a corresponding vertex of the second plurality of vertices and a corresponding vertex of the first plurality of vertices, and the corresponding vertex of the second plurality of vertices is multiplied by the weight value W and the corresponding vertex of the first plurality of vertices is multiplied by (1−W). In an embodiment, the method further includes the first weighting function is 1 and the fourth weighting function is zero, the second weighing function is one at the fourth boundary and gradually changes to about 0.2 at the third boundary, and the third weighing function gradually changes from about 0.2 at the third boundary to zero at the second boundary.

According to some embodiments of the present disclosure, layout enhancement system includes a main controller, a target layout pattern, a mask enhancer coupled to the main controller, a mask projector coupled to the main controller and the mask enhancer and produces a projection of the target layout pattern on a wafer, and an analyzer module coupled to the main controller. The analyzer module receives the target layout pattern to be produced on the wafer, wherein the analyzer module sends the target layout pattern to the mask projector to be projected on the wafer. The analyzer module receives, from the mask projector, a projection of the target layout pattern on the wafer and determines one or more enhancement regions of the target layout pattern based on the projection of the target layout pattern on the wafer. The mask enhancer is coupled to the analyzer module through the main controller and receives the target layout pattern from the analyzer module and performs one of an optical proximity correction (OPC) operation or an inverse lithographic transformation (ILT) operation of the target layout pattern. The analyzer module further determines a first enhancement region, in a first simulation zone, of the target layout pattern, also determines a stitching mobility zone inside the first simulation zone, the first enhancement region is in the stitching mobility zone and the stitching mobility zone is enclosed inside a first boundary of the first simulation zone, and further determines an optimization mobility zone inside the stitching mobility zone. The optimization mobility zone is enclosed inside a second boundary of the stitching mobility zone. The first enhancement region is in the optimization mobility zone, and a third boundary of the optimization mobility zone encloses a fourth boundary of the first enhancement region. The analyzer module also performs one of an optical proximity correction (OPC) operation or an inverse lithographic transformation (ILT) operation of the target layout pattern in the first simulation zone to generate an OPC corrected or an ILT adjusted layout pattern in the first simulation zone, and combines the OPC corrected or the ILT adjusted layout pattern and the target layout pattern in the first simulation zone to generate an enhanced layout pattern in the first simulation zone by: combining a weighted sum of the OPC corrected or the ILT adjusted layout pattern and the target layout pattern to generate the enhanced layout pattern by using: a first weighting function inside the fourth boundary, a second weighting function between the fourth boundary and the third boundary, a third weighting function between the third boundary and the second boundary, and a fourth weighting function between the second boundary and the first boundary. In an embodiment, the system further includes a mask generator. The mask generator produces a photo mask by disposing the enhanced layout pattern on a mask blank. In an embodiment, the analyzer module inspects the projection of the target layout pattern on the wafer to determine one or more defects of the projection of the target layout pattern on the wafer. An enhancement region of the target layout pattern corresponds to a defect of the projection of the target layout pattern on the wafer. In an embodiment, a layout pattern of a first enhancement region includes a hotspot region that generates a defective area when the target layout pattern is projected on the wafer, and the enhanced layout pattern of the first enhancement region does not generate a defective area, when projected on the wafer. In an embodiment, the system further includes a mask merger of the analyzer module. The mask merger combines a weighted sum of the OPC corrected or the ILT adjusted layout pattern and the target layout pattern to generate the enhanced layout pattern.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout enhancement system, comprising:
a main controller;
a target layout pattern;
a mask enhancer coupled to the main controller;
a mask projector coupled to the main controller and the mask enhancer and configured to produce a projection of the target layout pattern on a wafer; and
an analyzer module coupled to the main controller, wherein the analyzer module is configured to receive the target layout pattern to be produced on the wafer, wherein the analyzer module is configured to send the target layout pattern to the mask projector to be projected on the wafer,
wherein the analyzer module is configured to receive, from the mask projector, a projection of the target layout pattern on the wafer and to determine one or more enhancement regions of the target layout pattern based on the projection of the target layout pattern on the wafer, and
wherein the mask enhancer is coupled to the analyzer module through the main controller and is configured to receive the target layout pattern from the analyzer module and to perform one of an optical proximity correction (OPC) operation or an inverse lithographic transformation (ILT) operation of the target layout pattern, wherein the analyzer module is further configured to:
determine a first enhancement region, in a first simulation zone, of the target layout pattern,
determine a stitching mobility zone inside the first simulation zone, wherein the first enhancement region is in the stitching mobility zone and all sides of the stitching mobility zone are enclosed inside a first boundary of the first simulation zone,
determine an optimization mobility zone inside the stitching mobility zone, wherein all sides of the optimization mobility zone are enclosed inside a second boundary of the stitching mobility zone, wherein all sides of the first enhancement region are enclosed inside the optimization mobility zone, and wherein a third boundary of the optimization mobility zone encloses a fourth boundary of the first enhancement region,
perform one of an OPC operation or an ILT operation of the target layout pattern in the first simulation zone to generate an OPC corrected or an ILT adjusted layout pattern in the first simulation zone; and
combine the OPC corrected or the ILT adjusted layout pattern and the target layout pattern of a region surrounding the first simulation zone from all sides to generate an enhanced layout pattern in the first simulation zone by:
combining a weighted sum of the OPC corrected or the ILT adjusted layout pattern and the target layout pattern of the region surrounding the first simulation zone to generate the enhanced layout pattern by using:
a first weighting function inside the fourth boundary;
a second weighting function between the fourth boundary and the third boundary;
a third weighting function between the third boundary and the second boundary; and a fourth weighting function between the second boundary and the first boundary, wherein the region surrounding the first simulation zone extends beyond the first enhancement region into a neighboring region of the first enhancement region.

2. The layout enhancement system of claim 1, further comprising:

a mask generator, wherein the mask generator is configured to produce a photo mask by disposing the enhanced layout pattern on a mask blank.

3. The layout enhancement system of claim 1, wherein the analyzer module is further configured to inspect the projection of the target layout pattern on the wafer and to determine one or more defects of the projection of the target layout pattern on the wafer, and wherein the first enhancement region of the target layout pattern corresponds to a defect of the projection of the target layout pattern on the wafer.

4. The layout enhancement system of claim 1, wherein a layout pattern of the first enhancement region comprises a hotspot region that generates a defective area when the target layout pattern is projected on the wafer, and wherein the enhanced layout pattern of the first enhancement region does not generate the defective area when projected on the wafer.

5. The layout enhancement system of claim 4, further comprising a mask merger of the analyzer module, wherein the mask merger is configured to combine a weighted sum of the OPC corrected or the ILT adjusted layout pattern and the target layout pattern to generate the enhanced layout pattern.

6. A layout enhancement system, comprising:

a mask projector coupled to a main controller and configured to produce a projection of a target layout pattern on a wafer;

an analyzer module coupled to the main controller, wherein the analyzer module is configured to receive the target layout pattern to be produced on the wafer, to send the target layout pattern to be projected to the mask projector, to receive, from the mask projector, the projection of the target layout pattern on the wafer, to determine one or more enhancement regions of the target layout pattern based on the projection of the target layout pattern on the wafer, to determine a first enhancement region, in a first simulation zone, of the target layout pattern, to determine a stitching mobility zone inside the first simulation zone, and to determine an optimization mobility zone inside the stitching mobility zone, wherein the first enhancement region is in the stitching mobility zone, all sides of the stitching mobility zone are enclosed inside a first boundary of the first simulation zone, all sides of the optimization mobility zone are enclosed inside a second boundary of the stitching mobility zone, all sides of the first enhancement region are enclosed inside the optimization mobility zone, and a third boundary of the optimization mobility zone encloses a fourth boundary of the first enhancement region; and a mask enhancer coupled to the main controller, wherein the mask enhancer is configured to receive the target layout pattern from the analyzer module, to perform one of an optical proximity correction (OPC) operation or an inverse lithographic transformation (ILT) operation of the target layout pattern, wherein the analyzer module is further configured to combine an OPC corrected or an ILT adjusted layout pattern and the target layout pattern of a region surrounding a first simulation zone from all sides to generate an enhanced layout pattern in the first simulation zone, and the region surrounding the first simulation zone extends beyond a first enhancement region into a neighboring region of the first enhancement region.

7. The layout enhancement system of claim 6, wherein the analyzer module is further configured to perform one of the OPC operation or the ILT operation of the target layout pattern in the first simulation zone to generate the OPC corrected or the ILT adjusted layout pattern in the first simulation zone.

8. The layout enhancement system of claim 7, wherein the combining the OPC corrected or the ILT adjusted layout pattern and the target layout pattern in the first simulation zone to generate the enhanced layout pattern in the first simulation zone comprises:

combining a weighted sum of the OPC corrected or the ILT adjusted layout pattern and the target layout pattern to generate the enhanced layout pattern.

9. The layout enhancement system of claim 8, wherein the combining the weighted sum of the OPC corrected or the ILT adjusted layout pattern and the target layout pattern is performed by using:

a first weighting function inside the fourth boundary;

a second weighting function between the fourth boundary and the third boundary;

a third weighting function between the third boundary and the second boundary; and a fourth weighting function between the second boundary and the first boundary.

10. The layout enhancement system of claim 6, wherein the first enhancement region of the target layout pattern corresponds to a defect of the projection of the target layout pattern on the wafer.

11. The layout enhancement system of claim 6, wherein a layout pattern of the first enhancement region comprises a hotspot region that generates a defective area when the target layout pattern is projected on the wafer.

12. The layout enhancement system of claim 11, wherein the enhanced layout pattern of the first enhancement region does not generate the defective area when projected on the wafer.

13. A layout enhancement system, comprising:

an analyzer module coupled to a main controller and a mask projector that produces a projection of a target layout pattern on a wafer, wherein the analyzer module is configured to receive the target layout pattern to be produced on the wafer, to send the target layout pattern to be projected to the mask projector, to receive from the mask projector the projection of the target layout pattern on the wafer, to determine one or more enhancement regions of the target layout pattern based on the projection of the target layout pattern on the wafer, to determine a first enhancement region, in a first simulation zone, of the target layout pattern, to determine a stitching mobility zone inside the first simulation zone, and to determine an optimization mobility zone inside the stitching mobility zone, wherein the first enhancement region is in the stitching mobility zone, all sides of the stitching mobility zone are enclosed inside a first boundary of the first simulation zone, all sides of the optimization mobility zone are enclosed inside a second boundary of the stitching mobility zone, all sides of the first enhancement region are enclosed inside the optimization mobility zone, and a third boundary of the optimization mobility zone encloses a fourth boundary of the first enhancement region; and a mask enhancer coupled to the main controller, configured to receive the target layout pattern from the analyzer module, and configured to perform one of an optical proximity correction (OPC) operation or an inverse lithographic transformation (ILT) operation of the target layout pattern, wherein the analyzer module is further configured to combine an OPC corrected or an ILT adjusted layout pattern and the target layout pattern of a region surrounding a first simulation zone from all sides to generate an enhanced layout pattern in the first simulation zone, and the region surrounding the first simulation zone extends beyond a first enhancement region into a neighboring region of the first enhancement region.

14. The layout enhancement system of claim 13, further comprising a mask generator, wherein the mask generator is configured to produce a photo mask by disposing the enhanced layout pattern on a mask blank.

15. The layout enhancement system of claim 13, wherein a layout pattern of the first enhancement region comprises a hotspot region that generates a defective area when the target layout pattern is projected on the wafer.

16. The layout enhancement system of claim 15, wherein the enhanced layout pattern of the first enhancement regions does not generate the defective area when the target layout pattern is projected on the wafer.

17. The layout enhancement system of claim 1, wherein the OPC corrected or the ILT adjusted layout pattern gradually changes in an intermediate region between the first boundary of the first simulation zone and the fourth boundary of the first enhancement region.

18. The layout enhancement system of claim 1, wherein the analyzer module is further configured to perform the OPC operation of the target layout pattern and the ILT operation of the target layout pattern iteratively.

19. The layout enhancement system of claim 1, wherein the OPC operation of the target layout pattern and the ILT operation of the target layout pattern are performed iteratively in response to defects in the enhanced layout pattern.

20. The layout enhancement system of claim 6, wherein the analyzer module is further configured to perform the OPC operation of the target layout pattern and the ILT operation of the target layout pattern iteratively.

* * * * *